United States Patent [19]

Hull

[11] 4,342,927
[45] Aug. 3, 1982

[54] CMOS SWITCHING CIRCUIT

[75] Inventor: Charles G. Hull, Rosenberg, Tex.

[73] Assignee: Texas Instruments Incorporated, Dallas, Tex.

[21] Appl. No.: 133,239

[22] Filed: Mar. 24, 1980

[51] Int. Cl.³ .................................... H03K 19/08
[52] U.S. Cl. .............................. 307/452; 307/481
[58] Field of Search ............ 307/451, 452, 470, 479, 307/481, 579, 583, 585

[56] References Cited

U.S. PATENT DOCUMENTS 3,887,822 6/1975 Suzuki .................. 307/452 X

Primary Examiner—James W. Davie
Attorney, Agent, or Firm—Melvin Sharp; Leo N. Heiting; Robert D. Marshall, Jr.

[57] ABSTRACT

A CMOS switching circuit is disclosed which switches between first and second input signals, which are preferably phase and frequency related, in response to changes in the logical condition of a control signal.

6 Claims, 2 Drawing Figures

CMOS SWITCHING CIRCUIT

BACKGROUND OF THE INVENTION

1. Field of the Invention

The present invention relates generally to switching circuits and, more particularly, to a CMOS switching circuit which switches between first and second input signals.

2. Prior Art Statement

Various forms of multiplexing circuit have been provided for selectively coupling a predetermined one of a number of input signals to an output signal path, depending upon a selection control signal. Typically, the control signal is synchronized with the input signals to assure that the coupling is not interupted during transmission of an information pulse. In the absence of such a synchronization, excessively short digital pulses may appear on the output signal path and cause receiving circuitry to operate in an erratic and undesirable manner.

SUMMARY OF THE INVENTION

The CMOS switching circuit of the present invention is adapted to provide an output signal indicative of the logical condition of a selected one of two input signals, which are preferably phase and frequency related, depending upon the logical condition of an asynchronous control signal. More particularly, the CMOS switching circuit of the preferred embodiment is constructed to perform the switching operation in synchronization with the next normally occuring logical transition of the higher frequency input signal, following the logical transition of the control signal. Thus, the CMOS switching circuit, when constructed and utilized in accordance with the preferred embodiment and method of the present invention, provides an output signal which switches between opposite logical conditions at a rate no faster than that of the faster of two input signals, regardless of the transition instant of the control signal.

To achieve the above objects, the CMOS switching circuit of the present invention includes a storage node which provides a continous output signal indicative of the most recent logical condition established therein. Logic means are provided for establishing a logical high condition in response to the higher frequency input signal having a logical low condition and either the control signal having a logical high condition or both the control signal and the lower frequency input signal having a logical low condition. Logic means are also provided for establishing a logical low condition in the storage node in response to the higher frequency input signal having a logical low condition and either the control signal or the lower frequency input signal having a logical high condition.

Other objects and advantages of the present invention will be evident from the following detailed description when read in conjunction with the accompanying drawing which illustrates the preferred embodiment thereof.

DESCRIPTION OF THE PREFERRED EMBODIMENT

Figure 1:
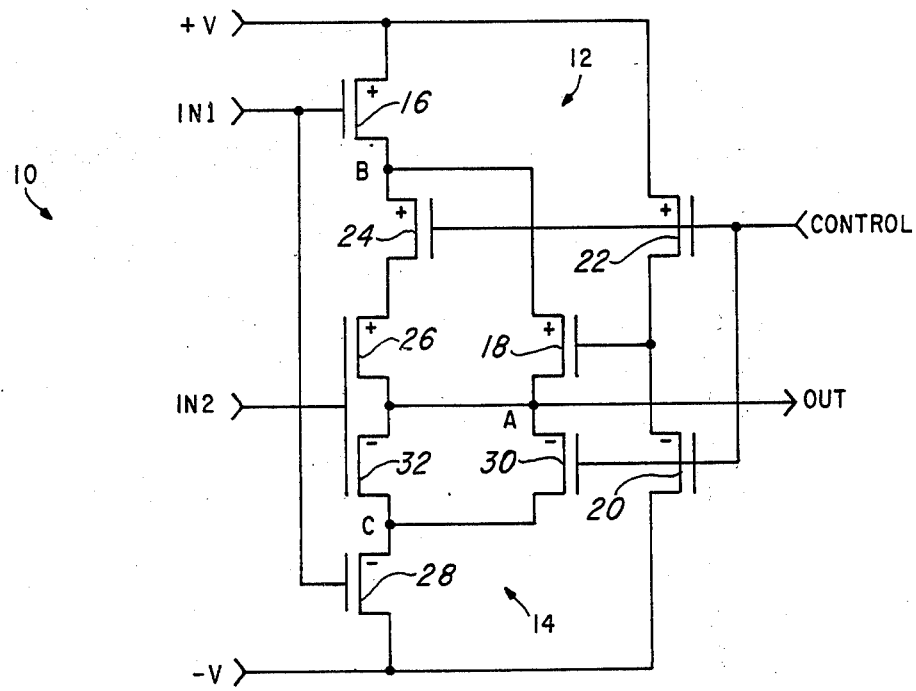
FIG. 1 is an electrical schematic of a CMOS switching circuit constructed in accordance with the preferred embodiment of the present invention.

Shown in FIG. 1 is a preferred embodiment of a CMOS switching circuit 10 which provides an output signal corresponding to one of two input signals, IN1 and IN2, selected by a control signal in accordance with the preferred method of the present invention. Preferably, one of the input signals, say IN1, has a frequency which is a multiple of the other input signal IN2, and the logical transitions of the input signal IN2 are generally in phase with, or slightly trail, related logical transitions of the input signal IN1. If these conditions are satisfied, the output signal provided by the switching circuit 10 will contain no output pulses which are shorter in width than the pulses comprising the input signal IN1.

In the illustrated form, the output signal path of the switching circuit 10 is represented as a storage node A which dynamically maintains a logical condition once established thereon. A first logic network 12 establishes a logical high condition on the storage node A in responsee to the input signal IN1 having a logical high condition and either the control signal having a logical high condition or both the control signal and the input signal IN2 having a logical low condition. A second logic network 14 establishes a logical low condition on the storage node A in response to the input signal IN1 having a logical low condition and either the control signal or the input signal IN2 having a logical low condition.

In the first logic network 12, a P-channel transistor 16 will couple an intermediate node B to a positive operating potential $+V$ if the input signal IN1 coupled to the gate thereof has a logical low condition. On the other hand, a P-channel transistor 18 will couple the storage node A to the intermediate node B if the control signal coupled to the gate thereof in a logically inverted condition via complementary N- and P-channel transistors 20 and 22, respectively, has a logical high condition. Similarly, a pair of series-connected P-channel transistors 24 and 26 will couple the storage node A to the intermediate node B if both the control signal and the input signal IN2 coupled to the respective gates thereof simultaneously have a logical low condition. Thus, the storage node A will be coupled to the positive operating potential $+V$ in response to the input signal IN1 having a logical high condition and either the control signal having a logical high condition or both the control signal and the input signal IN2 having a logical low condition.

In the second logic network 14, an N-channel transistor 28 will connect an intermediate node C to the negative operating potential $-V$ if the input signal IN1 coupled to the gate thereof has a logical high condition. On the other hand, a respective one of a pair of parallel-connected N-channel transistors 30 and 32 will couple the storage node A to the intermediate node C if either the control signal or the input signal IN2 coupled to the gates thereof has a logical low condition. Thus the storage node A will be coupled to the negative operating potential $-V$ in response to the input signal IN1 having a logical low condition and either the control signal or the input signal IN2 having a logical low condition.

Once the storage node A has been charged by the positive operating potential $+V$ to a logical high condition via the first logic circuit 12, the output signal provided on the output signal path of the switching circuit 10 will remain in the logical high condition for a period of time generally related to the capacitance and leakage characteristics of the circuitry coupled thereto. Similarly, once the storage node A has been discharged by the negative operating potential $-V$ to a logical low condition via the second logic circuit 14, the output signal provided on the output signal path will tend to remain in the logical low condition subject to the capacitance and leakage of the circuitry connected thereto. These and other considerations, such as the tradeoff between operating frequency and power dissipation, will be readily understood by those skilled in the art of CMOS circuit design and fabrication.

Figure 2:
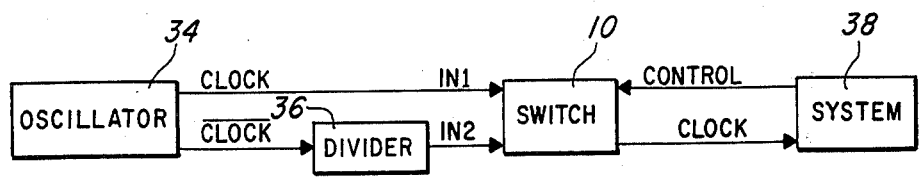
FIG. 2 is a schematic representation of a timing system which utilizes the switching circuit of FIG. 1 to asychronously switch between first and second clock signals.

Shown in FIG. 2 is a typical switching network in which the switching circuit 10 may be utilized to great advantage. In the illustrated form, an oscillator 34 of a convenient form provides a high frequency clock signal as the input signal IN1 of the switching circuit 10. The oscillator 34 also provides the logical inverse of the high frequency clock signal for application to a divider circuit 36. The divider 36, which may be of any preferred form such as the CMOS divider circuit shown and described in the copending U.S. patent application Ser. No. 130,299, filed Mar. 14, 1980, provides an output signal which is both frequency and phase related to the high frequency clock signal, as the input signal IN2 of the switching circuit 10. Depending upon the logical condition of a control signal provided by a system circuit 38, the switching circuit 10 will provide either the high frequency or the lower frequency clock signal for utilization by the system circuit 38. For example, it may be desirable in a calculator type system circuit 38 to operate at a slow, power conserving clock rate while awaiting a new operational command, and at a faster, higher power consuming clock rate while performing the operations necessary to accomplish such operational command. In this configuration, the clock signal provided to the system circuit 38 by the switching circuit 10 will contain no clock pulses which are shorter in width than the pulses comprising the high speed clock signal provided by the oscillator 34, regardless of the timing of the input-command-induced control signal.

Although the present invention has been described herein relative to one preferred embodiment thereof, various changes may be made in the construction or the arrangement of the parts or elements of the embodiments disclosed herein without departing from the spirit and scope of the present invention as defined in the appended claims.

What is claimed is:

1. A switching circuit comprising:
    storage means for maintaining a logical condition established therein, and for providing an output signal indicative of the maintained logical condition;
    first logic means for establishing a logical high condition in the storage means in response to a first input signal having a logical high condition and either a control signal having a logical high condition or both the control signal and a second input signal having a logical low condition; and
    second logic means for establishing a logical low condition in the storage means in response to the first input signal having a logical low condition and either the control signal or the second input signal having a logical low condition.

2. The switching circuit of claim 1 wherein the storage means is a capacitive storage node, and wherein the first logic means comprises:
    a P-channel transistor interposed between a positive operating potential and an intermediate storage node, and having a gate coupled to the first input signal;
    a complementary pair of N- and P-channel transistors interposed between the positive and a negative operating potential, and having gates coupled to the control signal;
    a P-channel transistor interposed between the intermediate node and the storage node, and having a gate coupled to the intersection of the complementary transistors; and
    a pair of P-channel transistors interposed in series between the intermediate node and the storage node, with the gate of a first one of said pair being coupled to the control signal and the gate of the second one of said pair being coupled to the second input signal.

3. The switching circuit of claim 2 wherein the second logic means comprises:
    an N-channel transistor interposed between the negative operating potential and a second intermediate node, and having a gate coupled to the first input signal; and
    a pair of N-channel transistors interposed in parallel between the second intermediate node and the storage node, with a first one of said pair being coupled to the control signal and the gate of the second one of said pair being coupled to the second input signal.

4. The switching circuit of claim 1 wherein the storage means is a capacitive storage node, and wherein the second logic means comprises:
    an N-channel transistor interposed between the negative operating potential and an intermediate node, and having a gate coupled to the first input signal; and
    a pair of N-channel transistors interposed in parallel between the intermediate node and the storage node, with a first one of said pair being coupled to the control signal and the gate of the second one of said pair being coupled to the second input signal.

5. A switching network comprising:
    means for providing first and second signals, each of which alternates in a predetermined manner between logical high and logical low conditions;
    a switching circuit comprising:
    storage means for maintaining a logical condition established therein, and for providing an output signal indicative of the maintained logical condition;
    first logic means for establishing a logical high condition in the storage means in response to the first signal having a logical high condition and either a control signal having a logical high condition or both the control signal and the second signal having a logical low condition; and
    second logic means for establishing a logical low condition in the storage means in response to the first signal having a logical low condition and either the control signal or the second signal having a logical low condition; and
    circuit means for providing the control signal in either a logical high condition or a logical low condition and for receiving the output signals provided by the storage means of the switching circuit.

6. The switching network of claim 5 wherein the means for providing the first and second signals provide the second signal at a predetermined frequency and phase relative to the first signal.

* * * * *